(12) United States Patent
Tajiri et al.

(10) Patent No.: US 8,482,074 B2
(45) Date of Patent: Jul. 9, 2013

(54) SEMICONDUCTOR DEVICE MANUFACTURING METHOD AND SEMICONDUCTOR DEVICE

(75) Inventors: Masayuki Tajiri, Osaka (JP); Takayoshi Hashimoto, Osaka (JP); Hisashi Yonemoto, Osaka (JP); Toyohiro Harazono, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/137,599

(22) Filed: Aug. 29, 2011

(65) Prior Publication Data

US 2012/0139052 A1    Jun. 7, 2012

Related U.S. Application Data

(62) Division of application No. 12/805,675, filed on Aug. 12, 2010, now Pat. No. 8,105,894.

(30) Foreign Application Priority Data

Aug. 19, 2009    (JP) ................................. 2009-190456

(51) Int. Cl.
*H01L 29/78*    (2006.01)
(52) U.S. Cl.
USPC ...................... 257/368; 257/392; 257/E29.06
(58) Field of Classification Search
USPC ............................................... 257/368, 392
See application file for complete search history.

(56) References Cited

U.S. PATENT DOCUMENTS

| | | | |
|---|---|---|---|
| 6,979,864 B2 | 12/2005 | Negoro et al. | |
| 7,172,940 B1 * | 2/2007 | Chen et al. | 438/258 |
| 7,259,071 B2 * | 8/2007 | Kim et al. | 438/286 |
| 7,303,951 B2 | 12/2007 | Kanamitsu et al. | |
| 7,514,337 B2 | 4/2009 | Jeong | |
| 7,683,455 B2 | 3/2010 | Inoue et al. | |
| 7,858,490 B2 | 12/2010 | Mitsuhira et al. | |
| 7,863,670 B2 | 1/2011 | Ishii et al. | |
| 7,919,389 B2 | 4/2011 | Goda et al. | |

(Continued)

FOREIGN PATENT DOCUMENTS

| | | |
|---|---|---|
| JP | 2002-170877 | 6/2002 |
| JP | 2004-247328 | 9/2004 |

(Continued)

*Primary Examiner* — Savitr Mulpuri
(74) *Attorney, Agent, or Firm* — Harness, Dickey & Pierce, PLC

(57) ABSTRACT

A formation method of an element isolation film according to which a high-voltage transistor with an excellent characteristic can be formed is provided. On a substrate, a gate oxide film is previously formed. A CMP stopper film is formed thereon, and thereafter, a gate oxide film and a CMP stopper film are etched. The semiconductor substrate is etched to form a trench. Further, before the trench is filled with a field insulating film, a liner insulating film is formed at a trench interior wall, and a concave portion at the side surface of the gate oxide film under the CMP stopper film is filled with the liner insulating film. In this manner, formation of void in the element isolation film laterally positioned with respect to the gate oxide film can be prevented.

5 Claims, 16 Drawing Sheets

U.S. PATENT DOCUMENTS

| | | |
|---|---|---|
| 2001/0049166 A1 | 12/2001 | Peschiaroli et al. |
| 2002/0068413 A1 | 6/2002 | Konishi |
| 2004/0056293 A1 | 3/2004 | Saito |
| 2004/0198019 A1 | 10/2004 | Yasui et al. |
| 2005/0106822 A1 | 5/2005 | Lee et al. |
| 2009/0068817 A1* | 3/2009 | Eun .............................. 438/425 |
| 2009/0315099 A1* | 12/2009 | Park et al. .................... 257/324 |
| 2010/0187639 A1* | 7/2010 | Iwamoto ....................... 257/392 |
| 2010/0203691 A1* | 8/2010 | Wu et al. ....................... 438/217 |

FOREIGN PATENT DOCUMENTS

| | | |
|---|---|---|
| JP | 2004-311487 | 11/2004 |
| JP | 2007-081301 | 3/2007 |
| JP | 2008-277510 | 11/2008 |
| KR | 2004-0019960 | 3/2004 |

* cited by examiner

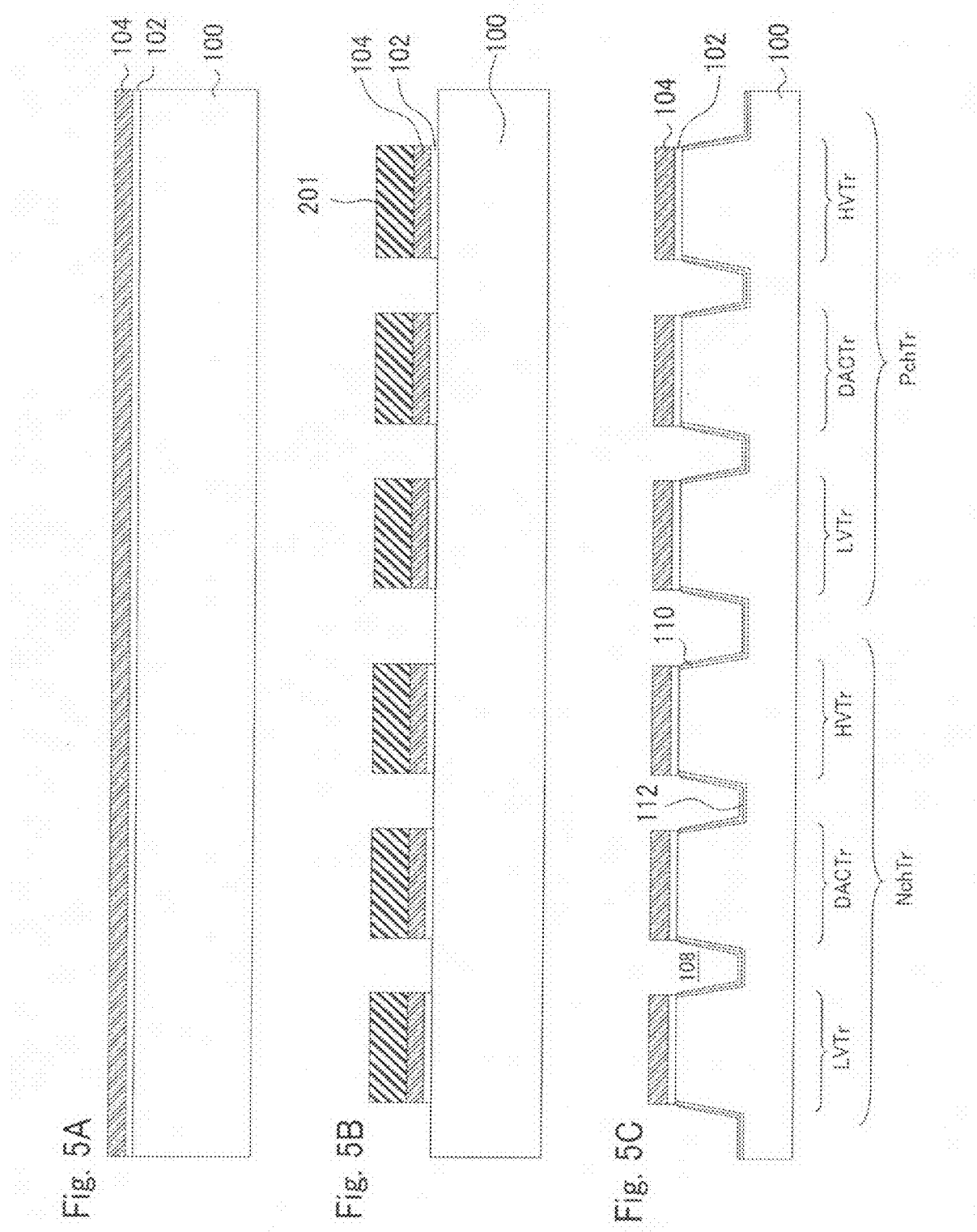

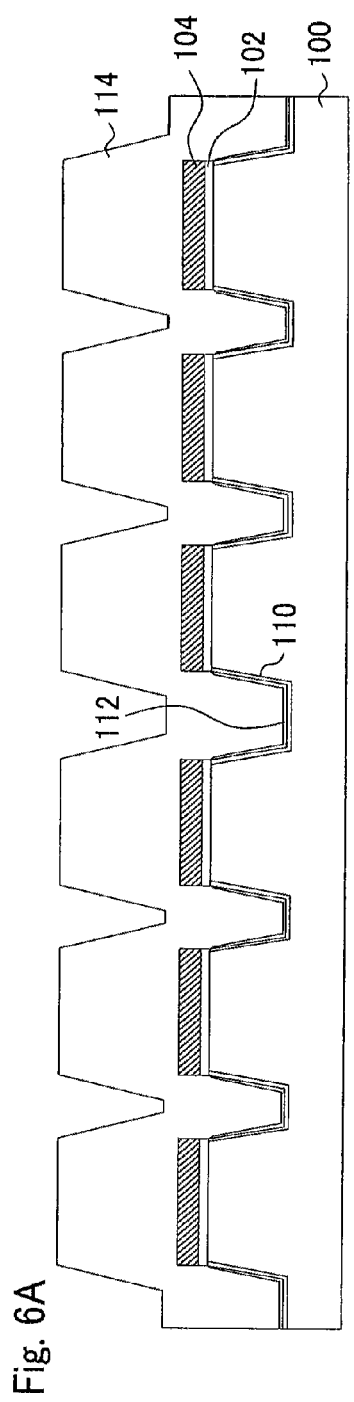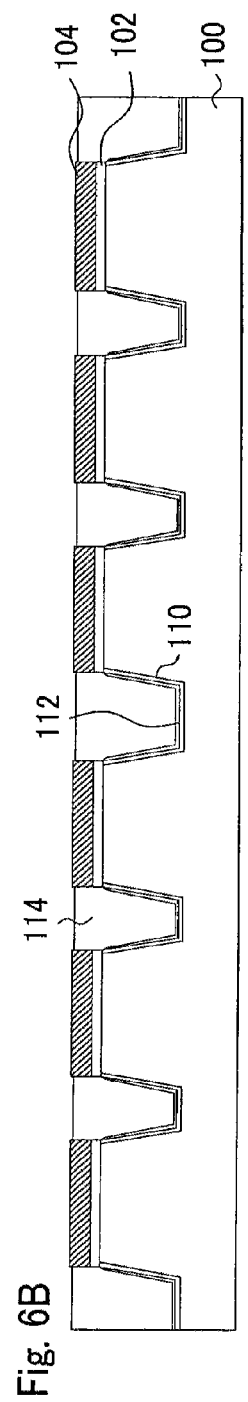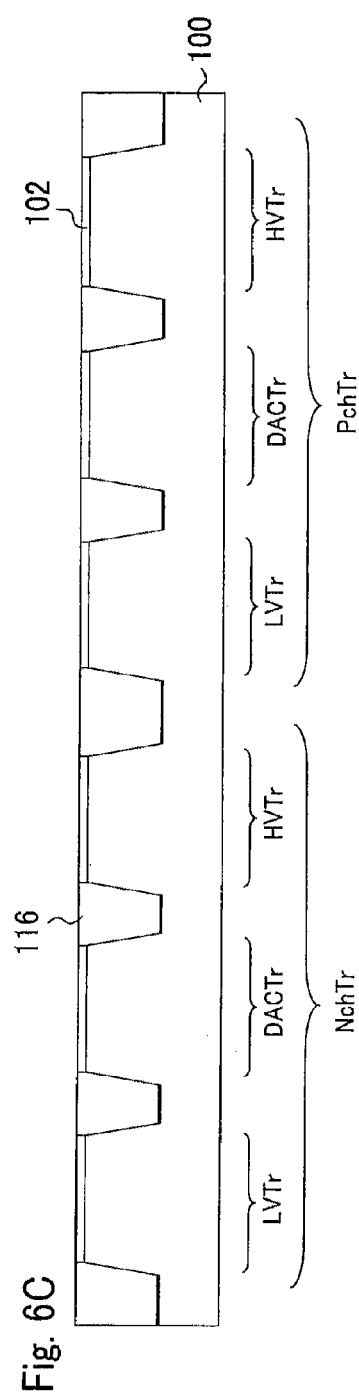

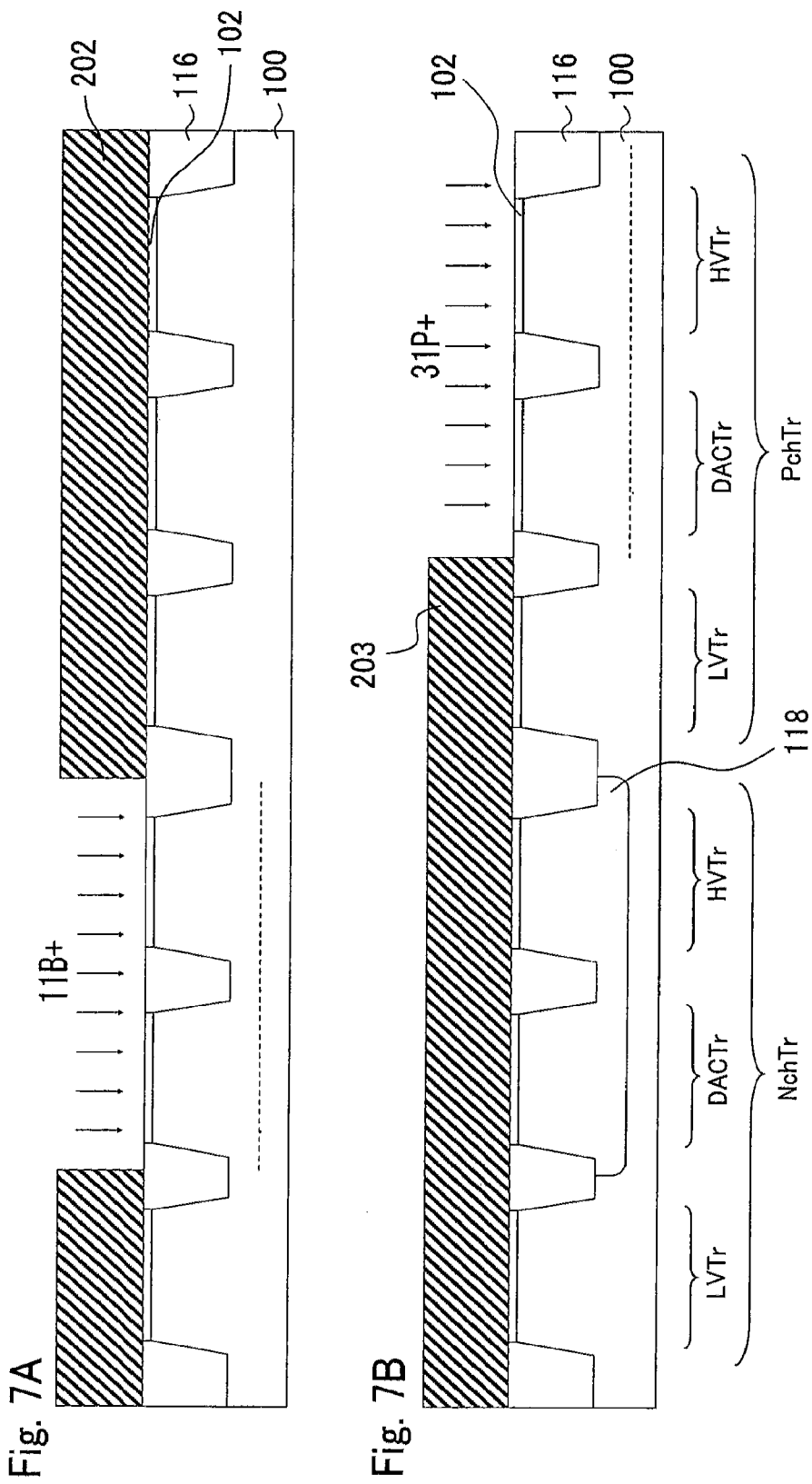

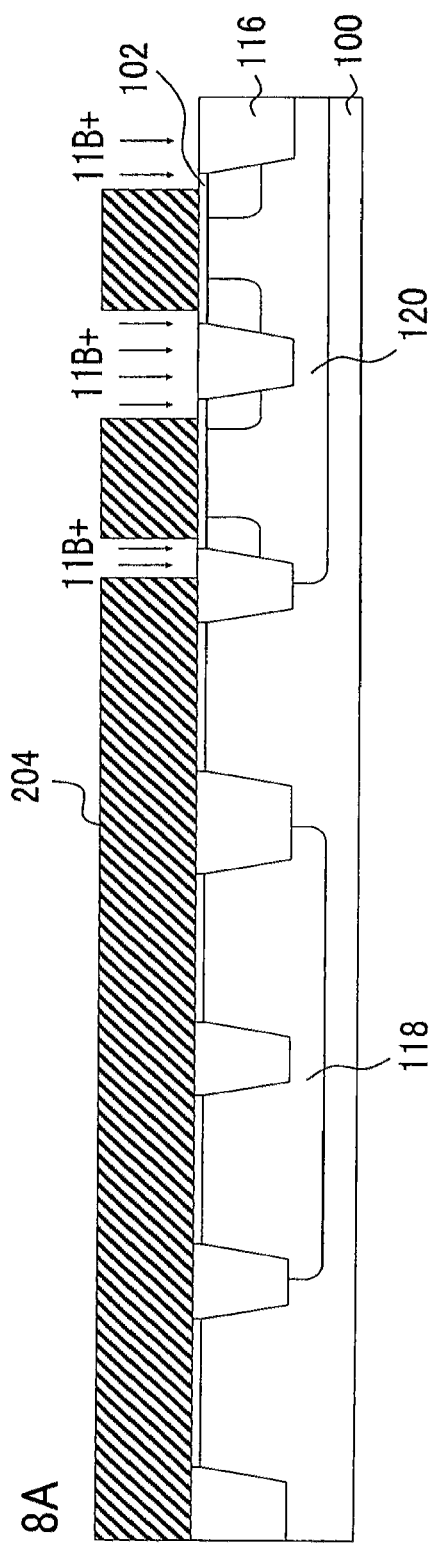
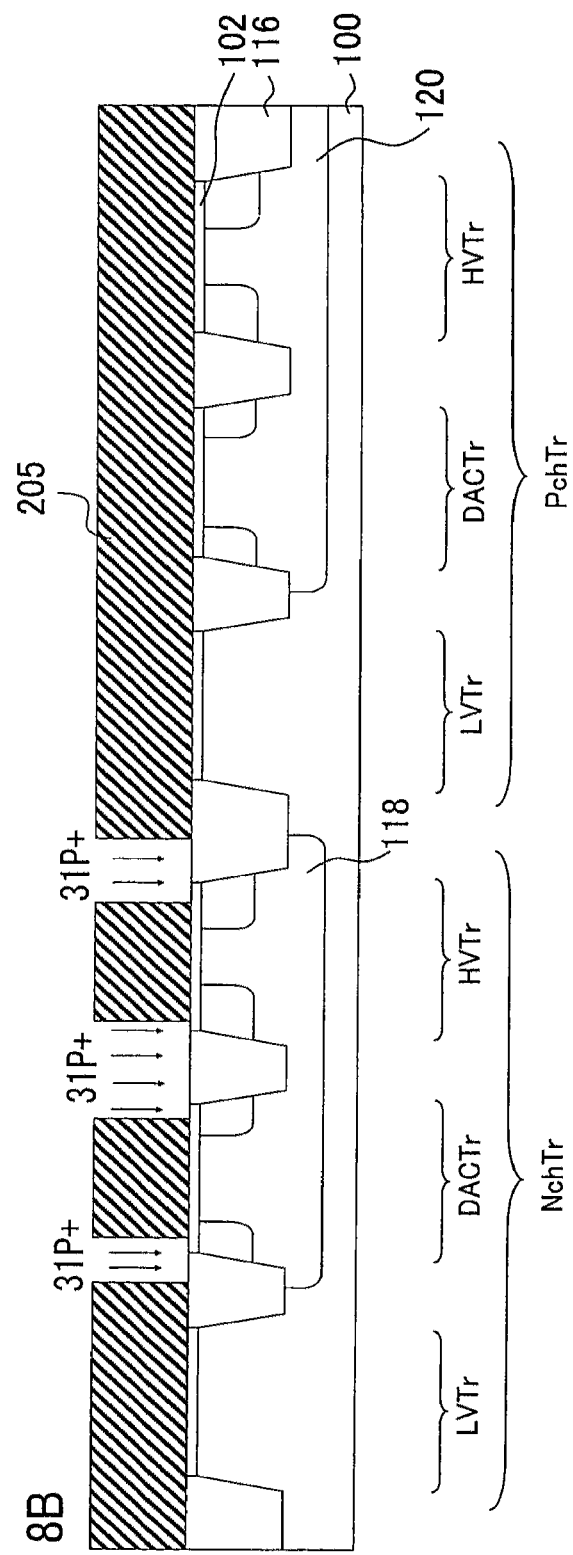
Fig. 8A
Fig. 8B

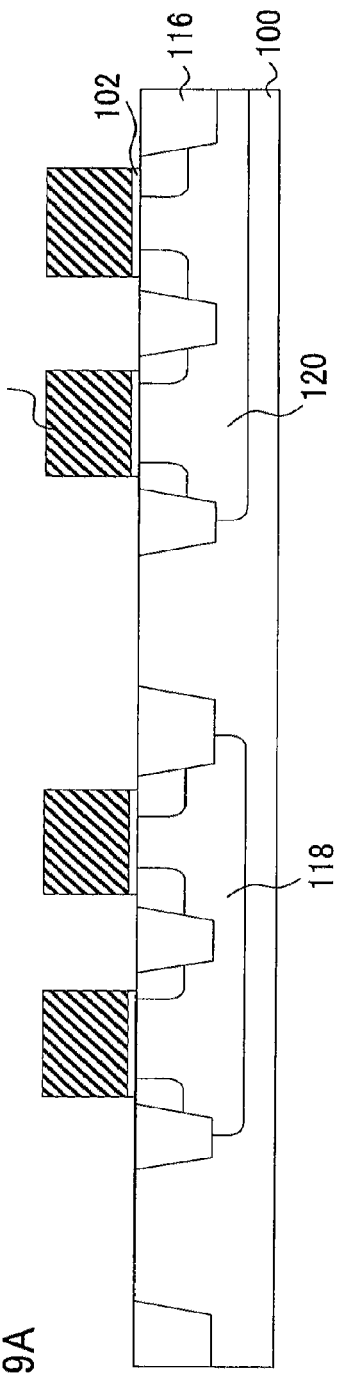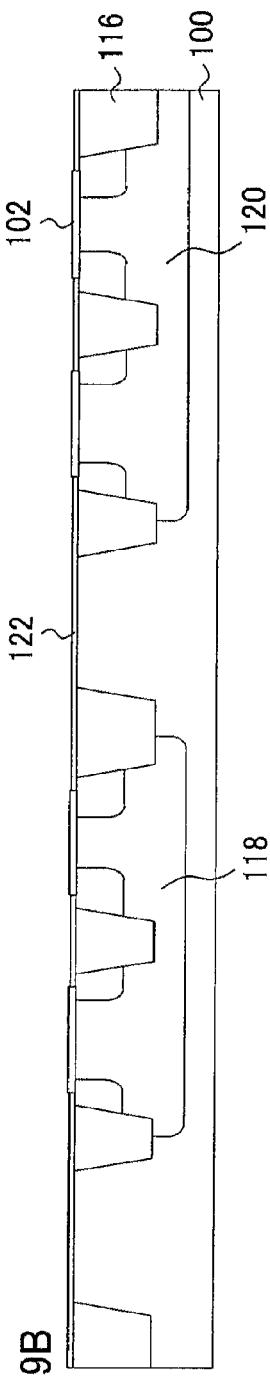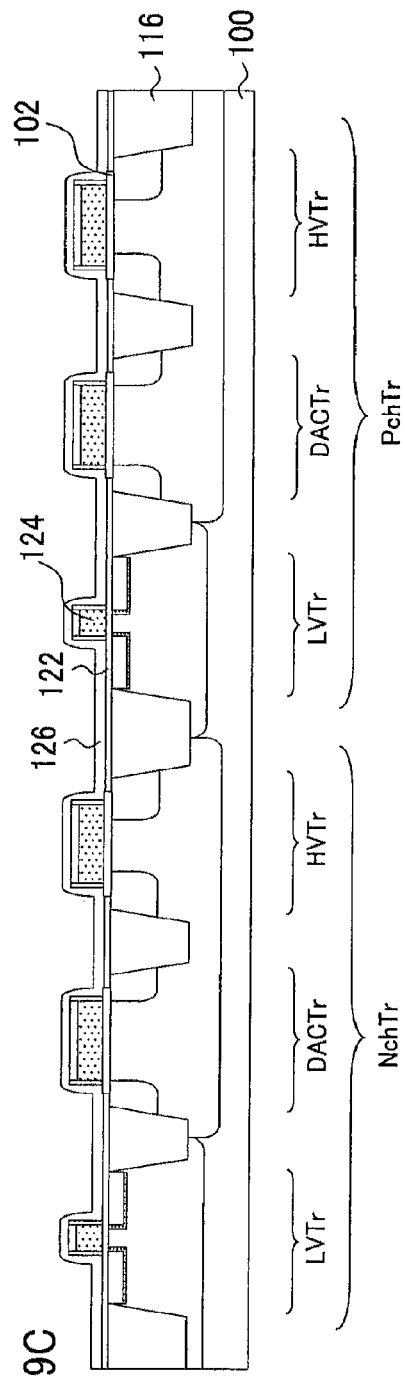

SEMICONDUCTOR DEVICE MANUFACTURING METHOD AND SEMICONDUCTOR DEVICE

CROSS REFERENCE TO RELATED APPLICATION

This U.S. nonprovisional application claims priority under 35 U.S.C. §121 as a divisional of U.S. application Ser. No. 12/805,675, filed Aug. 12, 2010 now U.S. Pat. No. 8,105,894, which claims priority under 35 U.S.C. §119 to Japanese Patent Application No. 2009-190456, filed on Aug. 19, 2009, in the Japanese Intellectual Property Office, the disclosure of each of which is hereby incorporated herein in its entirety by reference.

BACKGROUND

1. Field of the Invention

The present invention relates to a semiconductor device manufacturing method and a semiconductor device. In particular, the present invention relates to a formation method of an element isolation region for electrically isolating semiconductor elements from each other that are formed on a semiconductor substrate.

2. Description of the Related Art

As a method for electrically isolating semiconductor elements from each other, what is frequently used is a method including a step of forming a trench between active regions where semiconductor elements are to be formed on a substrate, and a step of filling the trench with an insulating material, so as to form an STI (Shallow Trench Isolation). FIGS. 13 to 16 show formation steps of an STI according to a conventional technique.

First, on an entire surface of a semiconductor substrate 100, an insulating film 101 (thermal oxide film) serving as a pad layer, and a CMP (Chemical Mechanical Polishing) stopper film 104 (SiN film) are formed in this order. Next, on the CMP stopper film 104, a resist 207 is formed with a pattern having an opening portion at each element isolation region. Next, using the resist as a mask, as shown in FIG. 13, the insulating film and the CMP stopper film are etched.

Next, after the resist 207 is removed, using the CMP stopper film 104 as a mask, the semiconductor substrate 100 is etched, so as to form a trench 108. Thereafter, as shown in FIG. 14, by thermally oxidizing the exposed plane of the substrate in the trench, a trench thermal oxide film 110 is formed. Next, by depositing a field insulating film 114 over the entire surface, the trench is filled with the field insulating film.

Next, as shown in FIG. 15, until the CMP stopper film 104 is exposed, the field insulating film is planarized. Thus, an element isolation film 116 is formed in the trench. Next, the CMP stopper film 104 is removed by carrying out etching with hot phosphoric acid. Each projection portion of the field insulating film 114 is subjected to the isotropic etching with etchant containing hydrofluoric acid, such that an element isolation region 117 is formed, as shown in FIG. 16. Further, on the substrate having formed thereon the element isolation region, a gate oxide film 102 is formed by thermal oxidation.

In liquid crystal display apparatuses such as liquid crystal displays and liquid crystal television sets, high-voltage transistors are installed in liquid crystal drivers that drive a display operation of a liquid crystal panel. In a case where an STI is formed, and a high-voltage transistor is then formed on each active region resulted by the element isolation in accordance with the above-described conventional technique, the thickness of the gate insulating film must be increased in order for the transistor to operate withstanding a high voltage. However, as in the above-described conventional technique, when the STI is formed and thereafter the gate insulating film having a great thickness is formed on the semiconductor substrate by the thermal oxidation, the thickness of the gate insulating film is reduced particularly at the peripheral portion of the active region and the STI corner portion. This results in the presence of kinks in the transfer characteristic of the transistor formed on the active region.

FIG. 1 is an SEM cross-sectional picture of an STI formed in accordance with the conventional technique, and FIG. 2 shows the relationship between a gate voltage Vg and a drain current Id of a transistor formed in accordance with the conventional technique. As shown in FIG. 1, it can be seen that the thickness of the gate oxide film (Gox) is reduced at the STI corner portion (encircled portion in FIG. 1). As a result, the characteristic of the transistor formed on the active region becomes a combination of respective characteristics of two types of transistors which are different in gate oxide film thickness. As shown in FIG. 2, when the substrate potential Vb is −2.5 to −7.5 [V], kink is observed in the relationship between the gate voltage Vg and the drain current Id (transfer characteristic), in the region where the drain current Id is $10^{-8}$ to $10^{-7}$ [A].

With the liquid crystal driver, such presence of kink in the transfer characteristic of the transistor causes incorrect gradation expression of a displayed image, which eventually leads to a poor image display performance of the liquid crystal display or the liquid crystal television set. Further, when the kink is significant, the leak current when the transistor is turned off becomes large, posing problems such as an increase in power consumption and heat emission.

One possible solution for such reduction in thickness of the gate oxide film at the STI corner portion may be the method disclosed in Japanese Unexamined Patent Application Publication No. 2004-247328 (hereinafter referred to as Document 1) that includes the steps of: previously forming a gate insulating film on a semiconductor substrate; forming a CMP stopper film thereon; etching the gate oxide film and the CMP stopper film; and etching the semiconductor substrate to form a trench; forming a trench thermal oxide film; filling the trench with a field oxide film; and planarizing the field insulating film until the CMP stopper film is exposed. However, this method must overcome the following problems (1) to (3).

(1) When the thickness of the gate oxide film is increased, in the step of etching the semiconductor substrate to form the trench, the gate oxide film whose side surface is exposed is also etched simultaneously with the semiconductor substrate. Thus, as shown in the cross-sectional view of FIG. 3, a concave portion of the gate oxide film 102 under the CMP stopper film 104 becomes great. When the trench 108 is filled with the field insulating film 114 in this state, the concave portion cannot be covered. Even when it can be covered, as shown in FIG. 4, a void may possibly be formed in the element isolation film laterally positioned with respect to the gate oxide film. As a result of formation of the void, the dielectric strength voltage of the transistor formed on the active region becomes low.

(2) According to the disclosure of Document 1, when the CMP stopper film is removed by etching, dry etching having low selectivity (for example, about three) with respect to the gate oxide film is employed in removing the CMP stopper film, in order to lessen the damage done to the gate oxide film positioned under the CMP stopper film. However, in such a manner, the etching may not be stopped with the CMP stopper film, but the gate oxide film may also be etched. This may invite variations in the thickness of the gate oxide film of the active region. As a result, kink appears in the transfer characteristic of the transistor formed on the active region.

(3) Further, according to the disclosure of Document 1, in an attempt to prevent the stress applied to the STI by the high temperature associated with the formation of the well, the following steps are carried out: after formation of a well on a semiconductor substrate, forming a gate oxide film and a CMP stopper film; etching the gate oxide film and the CMP stopper film; etching the semiconductor substrate to form a trench; and forming an STI in the trench. In such a case, however, the formation of the STI on the well causes the additive impurity (in particular, boron) on the well to diffuse toward the STI, due to the thermal treatment step in the formation of the STI. Accordingly, the impurity concentration of the active region in the STI corner portion is reduced. Consequently, the characteristic of the transistor is impaired, by a reduction in the threshold voltage of the transistor and the presence of kink in the transfer characteristic and the like.

On the other hand, the object of the technique of Document 1 is to suppress the stress applied to the STI, to thereby suppress the crystal defect attributed to the STI stress, and Document 1 is silent about the effect on the characteristic of the transistor formed on the active region.

SUMMARY

The present invention has been made to solve the problems associated with the conventional technique, and its object is to provide a formation method of an element isolation film according to which a high-voltage transistor having an excellent characteristic can be formed.

The first characteristic of a semiconductor device manufacturing method of the present invention for solving the aforementioned problems lies in that it includes: depositing a first gate oxide film and a CMP stopper film in this order on an entire surface of a substrate; etching the first gate oxide film and the CMP stopper film using a resist pattern having an opening portion at an element isolation region; forming a trench at the element isolation region on the substrate; thermally oxidizing an exposed plane of the substrate in the trench to form a trench thermal oxide film; forming a liner insulating film at an interior wall of the trench; depositing a field insulating film over the entire surface of the substrate and planarizing the field insulating film until the CMP stopper film is exposed so that the trench is filled with the field insulating film; removing the CMP stopper film by wet etching with an etchant containing hot phosphoric acid, to form at the element isolation region on the substrate an element isolation film including the trench thermal oxide film, the liner insulating film, and the field insulating film; forming a first well of one of a first conductivity type and a second conductivity type at a first active region, the first active region being at least a part of a plurality of regions partitioned by the element isolation film on the substrate; and forming a first transistor on the first well.

In accordance with the semiconductor device manufacturing method of the first characteristic, on a substrate, a first gate oxide film is previously formed, and a CMP stopper film is formed thereon. Then, the first gate oxide film and the CMP stopper film are etched, and the semiconductor substrate is etched, to form a trench. In this manner, a first gate oxide film whose top surface is flat over the entire active region and whose thickness is uniform can be formed.

Further, by forming a trench thermal oxide film after the trench is formed, the peripheral portion of the trench is rounded. This can lessen the electric field concentration applied to the STI corner portion.

Further, after the trench thermal oxide film is formed, a liner insulating film is formed in the trench before the trench is filled with a field oxide film. This can prevent formation of a void in the element isolation film laterally positioned with respect to the first gate oxide film. As the material of the liner insulating film, oxide films formed by CVD (Chemical Vapor Deposition), such as an HTO (High Temperature Oxide) film, a PTEOS (Plasma TEOS (Tetraethoxysilane)) film, an LTO (Low Temperature Oxide) film and the like are preferable. Among them, the HTO film is the most preferable because of its superiority in terms of closely packed film structure and step coverage.

Further, a field insulating film is deposited over the entire surface of the substrate, and planarized until the CMP stopper film is exposed. Thereafter, the CMP stopper film is removed by wet etching with an etchant having high selectivity with respect to the first gate oxide film (for example, selectivity of about 10 to 50) (for example, wet etching with hot phosphoric acid). As a result, it becomes possible to prevent the first gate oxide film under the CMP stopper film from being etched, to thereby suppress variations in thickness of the first gate oxide film. In this way, a first transistor having an excellent characteristic, i.e., whose transfer characteristics is free of kink, can be formed on the first active region.

Note that, the damage that may be done by the wet etching to the first gate oxide film can be recovered in a later step, i.e., a step of forming source and drain regions of the first transistor, or by an anneal treatment in a step of thermally oxidizing the polysilicon being a gate electrode and, hence, it does not pose any problem.

Further, because the step of forming the first well is carried out after the step of forming the element isolation film, the additive impurity on the first well does not diffuse into the element isolation film in the thermal treatment in the step of forming the well, and thus the impurity concentration does not decrease at the active region of the STI corner portion, so that it becomes possible to prevent the characteristic of the first transistor from being impaired.

Still further, the second characteristic of a semiconductor device manufacturing method of the present invention lies in that it further includes, in addition to the first characteristic: removing the first gate oxide film positioned at a prescribed region other than the first active region after forming the first well, and forming a second gate oxide film having a thickness smaller than that of the first gate oxide film; forming a second well of one of the first conductivity type and the second conductivity type at a second active region, the second active region being at least a part of a prescribed region other than the first active region among the plurality of regions partitioned by the element isolation film on the substrate; and forming on the second well a second transistor having a withstand voltage lower than that of the first transistor.

In accordance with the semiconductor device manufacturing method of the second characteristic, by forming the first gate oxide film for a high-voltage transistor at the first active region, and thereafter forming the second gate oxide film for a low-voltage transistor at the second active region, simultaneously with achieving the effect of the semiconductor device manufacturing method of the first characteristic, it becomes possible to mount the high-voltage transistor and the low-voltage transistor on an identical substrate.

Still further, the third characteristic of a semiconductor device manufacturing method of the present invention lies in that it further includes, in addition to one of the first and second characteristics: thermally oxidizing the exposed plane of the substrate in the trench to form a preliminary thermal oxide film before forming the trench thermal oxide film, and removing the preliminary thermal oxide film, wherein forming the trench thermal oxide film includes thermally oxidizing the exposed plane of the substrate in the trench again to form the trench thermal oxide film.

In accordance with the semiconductor device manufacturing method of the third characteristic, by forming the preliminary thermal oxide film before forming the trench thermal oxide film, removing the preliminary thermal oxide film, and thereafter carrying out thermal oxidation again to form a trench thermal oxide film, the damage done by the etching in the step of forming the trench can be recovered.

Further, in the semiconductor device manufacturing method according to the present invention, it is preferable that the preliminary thermal oxide film is formed at a thickness of 10 nm to 15 nm under a temperature of 700° C. to 1000° C.

Still further, in the semiconductor device manufacturing method according to the present invention, it is preferable that the trench thermal oxide film is formed at a thickness of 20 nm to 50 nm.

A thicker trench thermal oxide film facilitates rounding of the peripheral portion of the trench, thereby enhancing the effect of lessening the electric field concentration applied to the STI corner portion. On the other hand, a thicker trench thermal oxide film is prone to invite a void formation in the element isolation film laterally positioned with respect to the gate oxide film. Therefore, the most suitable thickness of the trench thermal oxide film can be adjusted to fall within a range of 20 nm to 50 nm, for example, when the thickness of the first gate oxide film is about 30 nm, although the thickness of the trench thermal oxide film is dependent also on the thickness of the first gate oxide film.

Further, in the semiconductor device manufacturing method according to the present invention, it is preferable that the trench thermal oxide film is formed under a temperature of 950° C. to 1250° C.

By carrying out thermal oxidation under high temperatures of 950° C. to 1250° C., it becomes possible to enhance the viscoelasticity of the silicon oxide film, to facilitate deformation by heat, and to form the rounded trench thermal oxide film.

Still further, in the semiconductor device manufacturing method according to the present invention, it is preferable that the liner insulating film is formed at a thickness of 40 nm to 60 nm.

The most suitable thickness of the liner insulating film can be adjusted to fall within a range of 40 nm to 60 nm, for example, when the thickness of the first gate oxide film is about 30 nm, although the thickness of the liner insulating film is dependent also on the thickness of the first gate oxide film and that of the trench thermal oxide film.

Further, in the semiconductor device manufacturing method according to the present invention, it is preferable that the CMP stopper film is removed by wet etching with hot phosphoric acid.

Still further, in the semiconductor device manufacturing method according to the present invention, it is preferable that the first gate oxide film is formed at a thickness equal to or smaller than 50 nm.

By setting the thickness of the gate oxide film to be equal to or smaller than 50 nm, a transistor that can withstand a voltage of about 20 V and that is excellent in terms of dielectric strength voltage and transfer characteristic can be formed on the active region having been subjected to the element isolation by the STI.

Further, in the semiconductor device manufacturing method according to the present invention, it is preferable that the first gate oxide film is formed by thermal oxidation.

As the gate oxide film, by using the thermal oxide film that is superior in terms of film quality (fewer defects) and thickness variations, the drawback of the gate oxide film, i.e., reduction in thickness at the STI corner portion, is compensated for by the present invention. Accordingly, a transistor having an excellent characteristic whose transfer characteristic is free of kink can be formed on the active region having been subjected to the element isolation by the STI.

A semiconductor device according to the present invention is characterized in including: a trench formed at a prescribed element isolation region on a substrate, the trench having its inside filled with an element isolation film being an insulating film; a gate oxide film formed on each of active regions partitioned by the element isolation film; a transistor formed in each of the active regions, the transistor having a source region and a drain region each formed at a part of region of a surface of the substrate, a channel region between the source region and the drain region, and a gate electrode formed over the channel region having the gate oxide film interposed therebetween; and a top surface of the gate oxide film is located at a position lower than a top surface of the insulating film, the top surface of the gate oxide film being flat over each of the entire active regions, wherein the closer a bottom surface of the gate oxide film at a peripheral portion of each of the active regions is to a boundary between the active region and the element isolation region, the more it is inclined downward, and the gate insulating film at the peripheral portion of the active region and the element isolation film adjacent thereto are free of a void.

With the semiconductor device characterized as above, a transistor having an excellent characteristic, which is superior in terms of dielectric strength voltage and whose transfer characteristic is free of kink can be mounted on the substrate.

Therefore, in accordance with the present invention, the aforementioned problems (1) to (3) associated with the conventional technique are all solved, and a transistor having an excellent characteristic, which is superior in terms of dielectric strength voltage and whose transfer characteristics is free of kink can be mounted on the active region having been subjected to the element isolation by the STI. Thus, it becomes possible to manufacture a substrate on which the transistor is mounted, so as to use as a liquid crystal driver that drives a display operation of a liquid crystal panel. This makes it possible to provide a liquid crystal display apparatus being free of incorrect gradation expression of a displayed image, and having an excellent image display performance. Further, by suppressing appearance of kink, it becomes possible to provide a liquid crystal display apparatus whose power consumption and heat emission are small.

BRIEF DESCRIPTION OF THE DRAWINGS

FIG. 5A to 5C are cross-sectional views schematically each showing a workpiece in a step in a semiconductor device manufacturing method of the present invention;

FIG. 6A to 6C are cross-sectional views schematically each showing the workpiece in a step in the semiconductor device manufacturing method of the present invention;

FIGS. 7A and 7B are cross-sectional views schematically each showing the workpiece in a step in the semiconductor device manufacturing method of the present invention;

FIGS. 8A and 8B is cross-sectional views schematically each showing the workpiece in a step in the semiconductor device manufacturing method of the present invention;

FIG. 9A to 9C are cross-sectional views schematically each showing the workpiece in a step in the semiconductor device manufacturing method of the present invention;

DETAILED DESCRIPTION

First Embodiment

Figure 1:
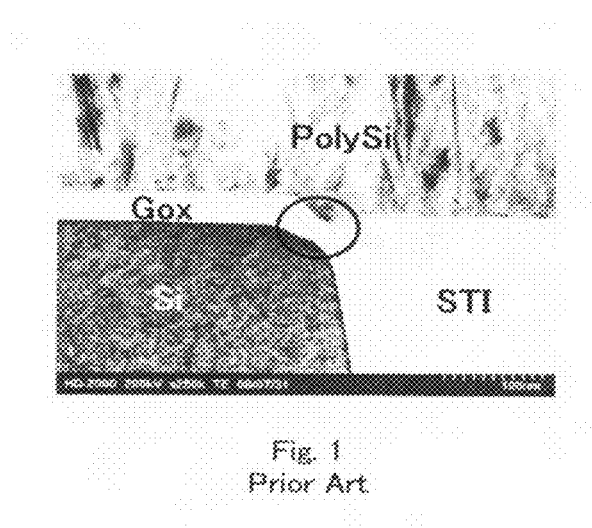
FIG. 1 is a cross-sectional SEM picture showing the shape of an STI corner portion according to a conventional technique.

In the following, a description will be given in detail of a semiconductor device manufacturing method according to an embodiment of the present invention (hereinafter, referred to as "the method of present invention" as appropriate). FIGS. 5A to 9C are cross-sectional views each schematically showing a workpiece in a step in the semiconductor device manufacturing method of the present invention. Note that, in the present embodiment, while the description will be given of an exemplary case in which the present invention is employed in manufacturing liquid crystal driver ICs used for controlling the display operation of liquid crystal displays, liquid crystal television sets and the like, the present invention is not limited thereto. In FIGS. 5A to 9C, the reference character NchTr denotes a portion where an N channel transistor is formed, and the reference character PchTr denotes a portion where a P channel transistor is formed. The reference character LVTr denotes each active region where a low-voltage logic transistor is formed, and the reference character DACTr denotes each active region where a high-voltage DAC transistor is formed, the high-voltage DAC transistor being for receiving a brightness control signal (digital signal) from the logic transistor and converting the same to an analog voltage setting signal. The reference character HVTr denotes each active region where a high-voltage source driver transistor is formed, the high-voltage source driver transistor being for supplying a voltage to a source bus line based on the voltage setting signal. It is also noted that, in the cross-sectional views each showing a workpiece in each step which will be referred to later, substantial portions are emphasized as appropriate and, accordingly, the dimensional ratio of the constituents on the drawings and the actual dimensional ratio thereof may not necessarily be the same.

First, on the entire surface of a semiconductor substrate 100, a first gate oxide film 102 is formed. As the material of the first gate oxide film, silicon oxide is desirable. Further, it is desirable that the gate oxide film is formed by thermal oxidation, because of its superiority in terms of film quality (fewer defects) and thickness variations. The thickness of the first gate oxide film 102 is set in accordance with the withstand voltage required by a transistor that is to be formed in a later step. In the present embodiment, it is 30 nm (withstand voltage 16.5 V).

Next, on the entire surface of the first gate oxide film, SiN is formed as a CMP stopper film 104. The material of the CMP stopper film 104 may be, in addition to silicon nitride (SiN), silicon oxynitride (SiON), polycrystalline silicon, or amorphous silicon, or a multilayered structure made up of at least two elements selected from the group consisting of silicon nitride, polycrystalline silicon, and amorphous silicon. The formation method of the CMP stopper film 104 may be a known film deposition method, for example, CVD. The CMP stopper film 104 should be just thick enough to serve as a stopper in the following CMP step. In the present embodiment, it is 160 nm. FIG. 5A shows a cross-sectional structure of the workpiece at this stage.

Next, on the CMP stopper film 104, a resist 201 is formed with a resist pattern having an opening portion at each element isolation region. Using the resist as a mask, the CMP stopper film 104 and the first gate insulating film 102 are etched. FIG. 5B shows a cross-sectional structure of the workpiece at this stage.

Next, the resist 201 is removed, and using the CMP stopper film 104 as a mask, the semiconductor substrate 100 is etched, so as to form a trench 108. The depth of the trench 108 is, for example, 250 nm to 1 μm, and it is 500 nm in the present embodiment. The semiconductor substrate 100 can be etched by dry etching.

Thereafter, the exposed plane of the semiconductor substrate 100 in the trench 108 is thermally oxidized, to form a preliminary thermal oxide film. Thereafter, the formed preliminary thermal oxide film is removed. A thickness of the preliminary thermal oxide film of, for example, 10 nm to 15 nm may suffice, and it is 11 nm in the present embodiment. A substrate temperature under thermal oxidation of 700° C. to 1000° C. may suffice, and it is 1000° C. in the present embodiment. Thus, the damage done by etching in the trench formation is recovered. The preliminary thermal oxide film can be removed by wet etching with hydrofluoric acid (HF) or ammonium fluoride (NH$_4$F).

Next, the exposed plane of the semiconductor substrate 100 in the trench 108 is again thermally oxidized, to form a trench thermal oxide film 110. A thickness of the trench thermal oxide film 110 of 20 nm to 50 nm may suffice, and it is 35 nm in the present embodiment. A substrate temperature under thermal oxidation of 950° C. to 1250° C. may suffice, and it is 1100° C. in the present embodiment. The thermal oxidation is carried out under such a high temperature for the purpose of enhancing the viscoelasticity of the silicon oxide films and facilitating deformation by heat. Thus, the peripheral portion of the trench is rounded, whereby the electric field concentration applied to the STI corner portion can be loosened.

Next, on the interior wall of the trench 108 and the trench thermal oxide film 110, an HTO film as a liner insulating film 112 is further formed by CVD. The material of the liner insulating film 112 may be, in addition to the HTO film, oxide films of PTEOS, LTO and the like formed by CVD. On the other hand, the most desirable material is the HTO film because of its superiority in terms of closely packed film structure and step coverage. This makes it possible for the concave portion of the side exposed plane of the first gate oxide film 102 to be filled with the liner insulating film 112, so as to prevent formation of a void laterally positioned with respect to the first gate oxide film 102.

It is to be noted that, while a greater thickness of the trench thermal oxide film 110 provides a greater effect of lessening the electric field concentration applied to the peripheral portion of the trench 108, a greater thickness is prone to invite formation of a void laterally positioned with respect to the first gate oxide film 102 and, hence, requires the liner insulating film 112 of greater thickness. Accordingly, the thickness of the liner insulating film 112 is dependent on both the thickness of the first gate oxide film 102 and the thickness of the trench thermal oxide film 110. Generally, the thickness of the liner insulating film 112 falling within a range of 40 nm to 60 nm is desirable, and it is 40 nm in the present embodiment. FIG. 5C shows a cross-sectional structure of the workpiece at this stage.

Next, on the entire surface of the semiconductor substrate 100, a field insulating film 114 is deposited, such that the trench 108 is filled with the field insulating film 114. The field insulating film 114 is a silicon oxide film (HDP film) formed by high density plasma CVD, for example. The field insulating film 114 should be just thick enough to allow the trench 108 to be filled therewith, and to cover at least the top surface of the CMP stopper film 104. In the present exemplary case, it is 800 nm. FIG. 6A shows a cross-sectional structure of the workpiece at this stage.

Next, the field insulating film 114 is planarized until the CMP stopper film 104 is exposed. FIG. 6B shows a cross-sectional structure of the workpiece at this stage. Next, the field insulating film 114 formed at an upper portion of the trench (laterally positioned with respect to the CMP stopper film 104) is removed. The removal of the field insulating film 114 can be carried out by wet etching with hydrofluoric acid, for example. Here, a natural oxide film formed on the top surface of the CMP stopper film is simultaneously removed. Thus, the removal of the CMP stopper film in the following step can be carried out in an excellent manner.

Next, the CMP stopper film 104 is removed. The removal of the CMP stopper film 104 is carried out by wet etching with an etchant having high selectivity with respect to the first gate oxide film 102 (for example, wet etching with hot phosphoric acid). A selectivity of about 10 to 50 may suffice, and desirably it is equal to or greater than 30. This can prevent the first gate oxide film under the CMP stopper film from being etched, to thereby suppress variations in thickness of the first gate oxide film. Note that, at this stage, while the first gate oxide film 102 may possibly be damaged by etching, such damage of the first gate oxide film can be recovered in a later step, i.e., a step of forming source and drain regions of the first transistor, or by an anneal treatment in a step of thermally oxidizing the polysilicon being a gate electrode.

Thus, as shown in FIG. 6C, an element isolation film 116 made up of the trench thermal oxide film 110, the liner insulating film 112, and the field insulating film 114 is formed in the trench.

Next, in the active regions where high-voltage transistors are to be formed, a p type first well is formed. Specifically, a resist 202 is formed with a resist pattern having an opening portion at the active regions DACTr and HVTr in the NchTr portion where N channel transistors are to be formed, and by carrying out ion implantation of a p type impurity such as boron using the resist as a mask, a p type deep well (HVPW) 118 is formed in the semiconductor substrate 100. FIG. 7A shows a cross-sectional structure of the workpiece at this stage.

Similarly, in the active regions where high-voltage transistors are to be formed, an n type first well is formed. Specifically, a resist 203 is formed with a resist pattern having an opening portion at the active regions DACTr and HVTr in the PchTr portion where P channel transistors are to be formed, and by carrying out ion implantation of an n type impurity such as phosphorus using the resist as a mask, an n type deep well (HVNW) 120 is formed in the semiconductor substrate 100. FIG. 7B shows a cross-sectional structure of the workpiece at this stage.

Next, in the active regions where high-voltage transistors are to be formed, p type source and drain regions are formed. Specifically, a resist 204 is formed with a resist pattern having opening portions at the source region and the drain region of the active regions DACTr and HVTr in the PchTr portion where P channel transistors are to be formed, and by carrying out ion implantation of a p type impurity such as boron using the resist as a mask, the p type source and drain regions are formed in the n type well 120. FIG. 8A shows a cross-sectional structure of the workpiece at this stage.

Similarly, in the active regions where high-voltage transistors are to be formed, n type source and drain regions are formed. Specifically, a resist 205 is formed with a resist pattern having opening portions at the source region and the drain region of the active regions DACTr and HVTr in the NchTr portion where N channel transistors are to be formed, and by carrying out ion implantation of an n type impurity such as phosphorus using the resist as a mask, the n type source and drain regions are formed in the p type well 118. FIG. 8B shows a cross-sectional structure of the workpiece at this stage.

Next, a resist 206 is formed with a resist pattern having opening portions at regions except for regions where gate electrodes are to be formed in the active regions where high-voltage transistors are to be formed. Then, the first gate oxide film is etched, to remove the first gate oxide film from the regions except for the gate electrode formation regions of the to-be-formed high-voltage transistors. FIG. 9A shows a cross-sectional structure of the workpiece at this stage.

Next, the resist 206 is removed, and on the active regions where low-voltage transistors are to be formed, and on the active regions over the source region and the drain region of the to-be-formed high-voltage transistors, a second gate oxide film 122 whose thickness is smaller than that of the first gate oxide film is formed by thermal oxidation. The thickness of the second gate oxide film is about 6 nm, for example. FIG. 9B shows a cross-sectional structure of the workpiece at this stage.

Thereafter, (a) in the active regions LVTr where low-voltage transistors are to be formed, a p type second well is formed in the NchTr portion, and an n type second well is formed in the PchTr portion by carrying out ion implantation of respective impurities; (b) polysilicon serving as a gate electrode material is deposited on the entire surface; (c) a gate electrode 124 is formed on each of the first gate oxide films 102 of the to-be-formed high-voltage transistors, and on the second gate oxide films 122 of the to-be-formed low-voltage transistors; (d) a source region and a drain region are formed on each of the second wells where low-voltage transistors are to be formed; and (e) further, as an insulating film 126 for forming sidewalls, SiN is deposited on the entire surface (for example, by 95 nm). Thus, as shown in FIG. 9C, a low-voltage N channel logic transistor is formed at the active region LVTr of the NchTr portion; a high-voltage N channel transistor is formed at each of the active regions DACTr and HVTr of the NchTr portion; a low-voltage P channel logic transistor is formed at the active region LVTr of the PchTr portion; and a high-voltage P channel transistor is formed at each of the active regions DACTr and HVTr of the PchTr portion. It is noted that the above-described manufacturing steps (a) to (e) of the high-voltage transistors and the low-voltage transistors are of known manufacturing process technique, and not the gist of the present invention. Therefore, the descriptions thereof are omitted. Further, low-voltage transistors shown in FIG. 9C each have a so-called LDD (Lightly Doped Drain) structure. Accordingly, at the boundary between the source region and the drain region, a high density impurity region whose conductivity type is opposite to that of the source region and the drain region, i.e., being the same conductivity type as the second well, is formed on each of the active region LVTr of the NchTr portion and that of the PchTr portion by halo implantation.

Second Embodiment

Figure 10:
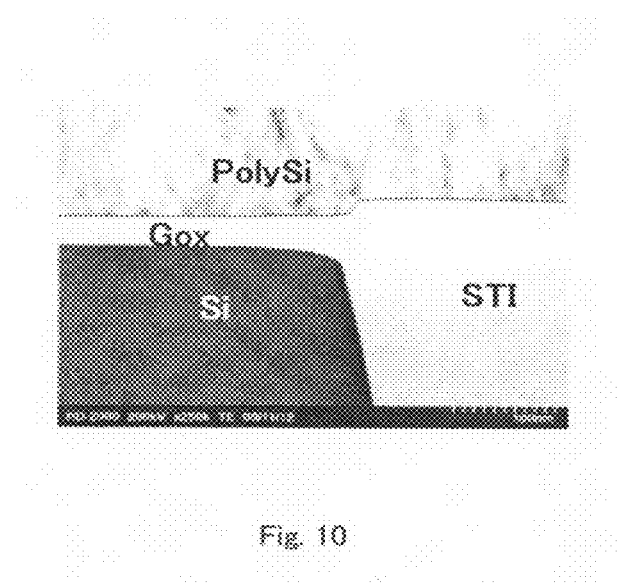
FIG. 10 is a cross-sectional SEM picture showing the shape of an STI corner portion after the present invention is applied.

An SEM cross-sectional picture of an STI formed according to the method of the present invention is shown in FIG. 10 as an example. As shown in FIG. 10, it can be seen that, by applying the method of the present invention, a reduction in thickness of the gate oxide film at the STI corner portion is suppressed, and that the gate oxide film (Gox) whose top surface is flat across the active regions is obtained. Further, owing to the fact that the gate oxide film is formed before the STI is formed, the top surface of the gate oxide film is positioned at a position lower than the top surface of the element isolation film of the STI. On the other hand, in the peripheral portion of each active region, the bottom surface of the gate oxide film has a rounded shape whose depthwise position is inclined downward as approaching the boundary with the STI.

Figure 4:
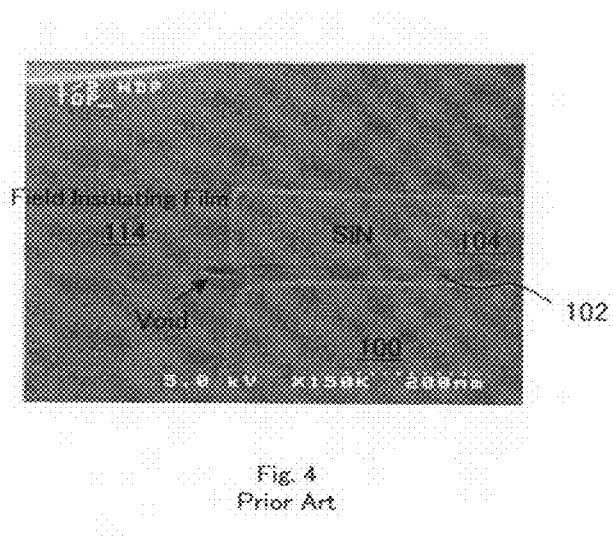
FIG. 4 is a cross-sectional SEM picture showing the cross-sectional structure of the STI corner portion in the case where the invention disclosed in Document 1 is applied (after being filled with the field insulating film)
Figure 11:
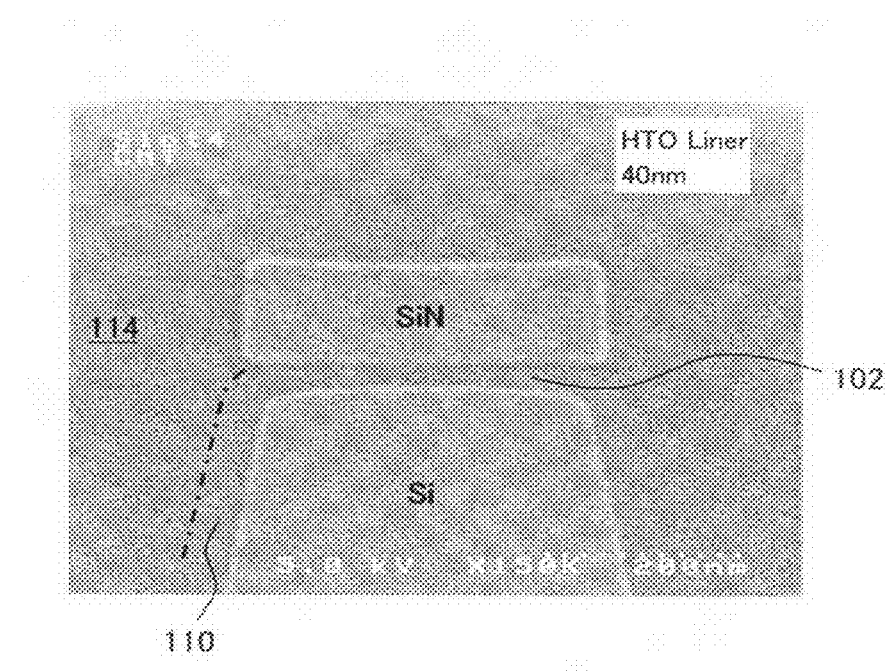
FIG. 11 is a cross-sectional SEM picture showing the cross-sectional structure of the STI corner portion after the present invention is applied (after being filled with a field insulating film)

FIG. 11 is an SEM cross-sectional picture of the semiconductor substrate, after the trench is formed and the field insulating film 114 is deposited according to the method of the present invention. Here, the thickness of the first gate oxide film 102 is 30 nm, and the thickness of the trench thermal oxide film 110 is 35 nm. Before forming the trench thermal oxide film 110, the preliminary thermal oxide film is formed by 11 nm, and thereafter, the preliminary thermal oxide film is removed by the hydrofluoric acid treatment. Further, as the liner insulating film, an HTO film is deposited by 40 nm. In FIG. 11, the boundary between the trench thermal oxide film and the liner insulating film is represented by a dashed-dotted line. As shown in FIG. 11, it can be seen that there is no void in the gate insulating film at the peripheral portion of the active region, and the void that is present in the element isolation film laterally positioned and adjacent to the gate insulating film in FIG. 4 disappears, by the formation of the liner insulating film, whereby a homogeneous element isolation film is formed.

Figure 2:
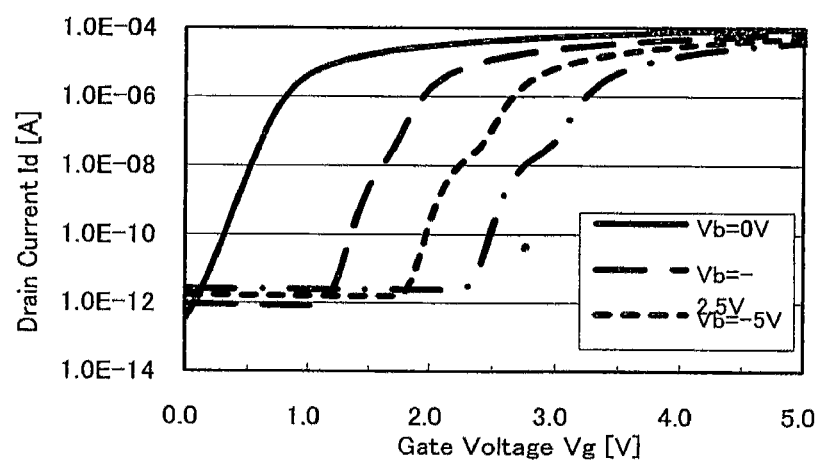
FIG. 2 shows the transfer characteristic of a transistor formed at an active region in accordance with the conventional technique.
Figure 3:
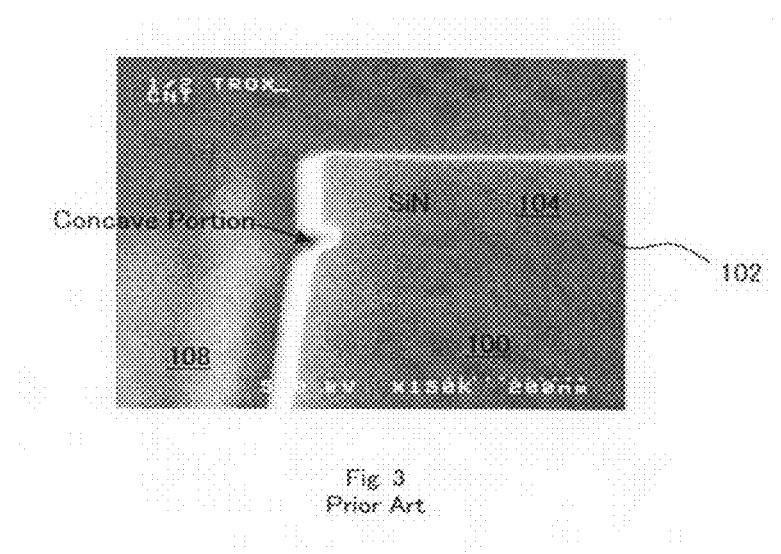
FIG. 3 is a cross-sectional SEM picture showing the cross-sectional structure of an STI corner portion in a case where the invention disclosed in Document 1 is applied (before being filled with a field insulating film)
Figure 12:
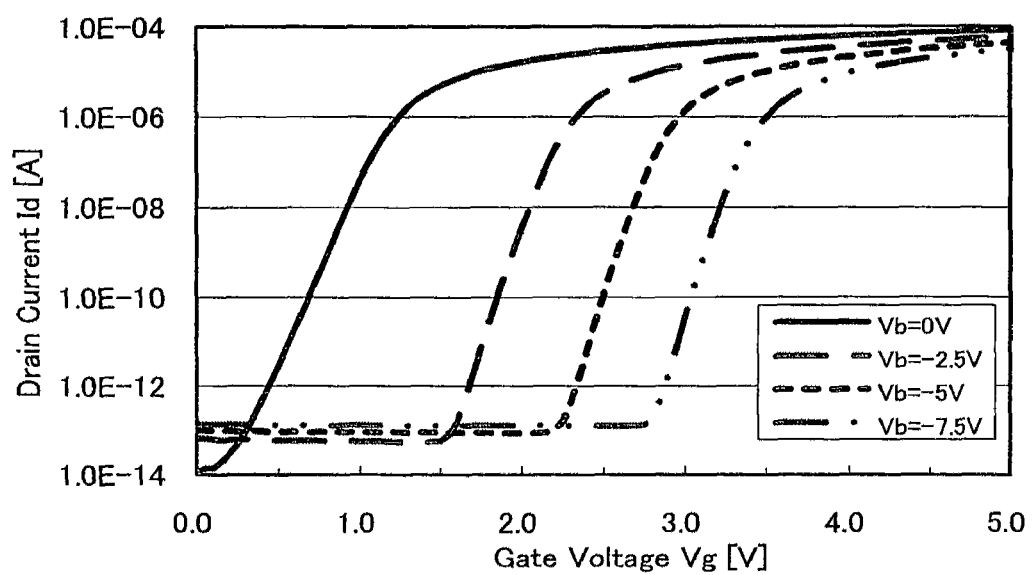
FIG. 12 is a graph showing the transfer characteristic of a transistor formed on an active region on a substrate by applying the present invention.
Figure 13:
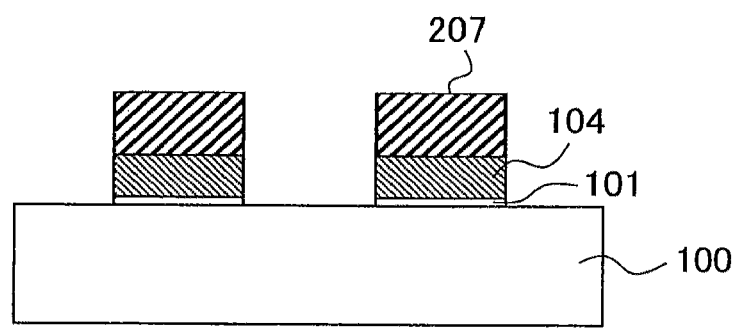
FIG. 13 is a cross-sectional view schematically showing a workpiece in a step in a formation method of an STI element isolation film according to a conventional technique.
Figure 14:
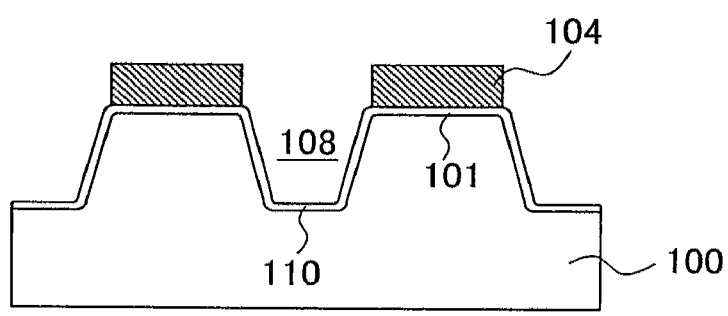
FIG. 14 is a cross-sectional view schematically showing the workpiece in a step in the formation method of an STI element isolation film according to the conventional technique.
Figure 15:
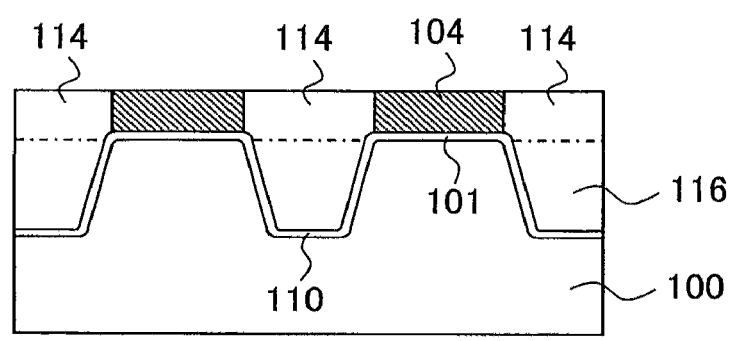
FIG. 15 is a cross-sectional view schematically showing the workpiece in a step in the formation method of an STI element isolation film according to the conventional technique.
Figure 16:
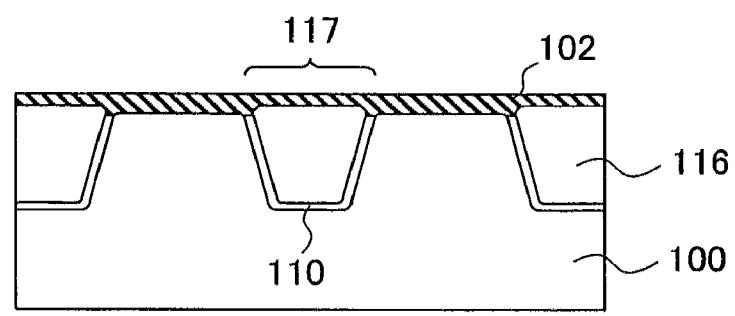
FIG. 16 is a cross-sectional view schematically showing the workpiece in a step in the formation method of an STI element isolation film according to the conventional technique.

As a result, the transfer characteristic of the transistor formed on each active region achieves the performance shown in FIG. 12. As compared to FIG. 2, it can be seen that a transistor having an excellent characteristic is formed, which is free of kink in the relationship between the gate voltage Vg and the drain current Id (transfer characteristics).

The present invention can be employed as a semiconductor device manufacturing method. In particular, the present invention can be employed in forming an element isolation film for forming a high-voltage transistor having an excellent characteristic on each active region.

Although the present invention has been described in terms of a preferred embodiment, it will be appreciated that various modifications and alterations might be made by those skilled in the art without departing from the invention. The invention should therefore be measured in terms of the claims which follow.

What is claimed is:

1. A semiconductor device, comprising:
    a trench formed at a prescribed element isolation region on a substrate, the trench having its inside filled with an element isolation film;
    a first gate oxide film formed on a first active region, the first active region being at least a part of a plurality of active regions partitioned by the element isolation film;
    a first transistor formed in each of the active regions in the first active region, the first transistor having a source region and a drain region each formed at a part of a region of a surface of the substrate, a channel region between the source region and the drain region, and a gate electrode formed over the channel region having the first gate oxide film interposed therebetween; and
    a second gate oxide film formed on a second active region, the second active region being at least a part of a prescribed region other than the first active region among the plurality of active regions partitioned by the element isolation film, the second gate oxide film having a thickness smaller than that of the first gate oxide film, wherein
    a top surface of the first gate oxide film is located at a position lower than a top surface of the element isolation film, the top surface of the first gate oxide film being flat over each of the entire active regions in the first active region,
    the closer a bottom surface of the first gate oxide film at a peripheral portion of each of the active regions is to a boundary between the active region and the element isolation region, the more it is inclined downward, and
    the first gate oxide film at the peripheral portion of the active region and the element isolation film adjacent thereto are free of a void.

2. The semiconductor device of claim 1, further comprising:
    a second transistor formed in each of the active regions in the second active region, wherein
    the first transistor is a high-voltage transistor, and the second transistor is a low-voltage transistor.

3. The semiconductor device of claim 1, wherein the first gate oxide film has a width equal to or greater than that of the gate electrode.

4. The semiconductor device of claim 1, further comprising:
    a liner insulating film formed between the trench and the element isolation film.

5. The semiconductor device, of claim 4, further comprising:
    a thermal oxide film formed between the trench and the liner insulating film.

* * * * *